US010055537B2

(12) United States Patent
Kolbet et al.

(10) Patent No.: US 10,055,537 B2
(45) Date of Patent: Aug. 21, 2018

(54) SIMULATION METHODS AND SYSTEMS FOR AN AIRCRAFT

(71) Applicant: HONEYWELL INTERNATIONAL INC., Morristown, NJ (US)

(72) Inventors: David Michael Kolbet, Scottsdale, AZ (US); Kevin Marshall, Peoria, AZ (US); Daniel Lutz, Glendale, AZ (US); Charles Yager, Chandler, AZ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

(21) Appl. No.: 13/827,010

(22) Filed: Mar. 14, 2013

(65) Prior Publication Data

US 2014/0278313 A1 Sep. 18, 2014

(51) Int. Cl.
| G06G 7/48 | (2006.01) |
| G06F 17/50 | (2006.01) |
| G05B 17/02 | (2006.01) |
| G05B 23/02 | (2006.01) |
| B64F 5/60 | (2017.01) |

(52) U.S. Cl.
CPC ............ *G06F 17/5095* (2013.01); *B64F 5/60* (2017.01); *G05B 17/02* (2013.01); *G05B 23/0216* (2013.01)

(58) Field of Classification Search
CPC . G06F 17/5009; G06F 17/5095; B64D 45/00; G01M 99/005; B64C 19/00; G05B 17/02; G05B 23/0216; H04Q 9/00; B64F 5/60
USPC .......................................................... 703/8
See application file for complete search history.

(56) References Cited

U.S. PATENT DOCUMENTS

| 3,678,256 | A | * | 7/1972 | Harenberg, Jr. ................. 701/16 |
| 5,023,791 | A | * | 6/1991 | Herzberg et al. ............ 701/33.4 |
| 5,111,402 | A | * | 5/1992 | Brooks et al. ............... 701/29.2 |
| 5,184,312 | A | * | 2/1993 | Ellis .............................. 702/121 |
| 5,671,141 | A | * | 9/1997 | Smith et al. ................. 701/33.6 |
| 5,974,349 | A | | 10/1999 | Levine |
| 6,208,955 | B1 | * | 3/2001 | Provan et al. .................. 703/20 |
| 6,418,361 | B2 | | 7/2002 | Sinex |
| 6,499,005 | B2 | * | 12/2002 | Gunderson et al. .............. 703/8 |
| 6,622,972 | B2 | * | 9/2003 | Urnes et al. .................. 244/194 |

(Continued)

FOREIGN PATENT DOCUMENTS

| WO | 0193043 A1 | 12/2001 |
| WO | 2011058076 A1 | 5/2011 |

OTHER PUBLICATIONS

C. Ananda, "Re configuration of Task in Flight Critical System Error Detection and Control," Digital Avionics Systems Conference, (DASC 2009), IEEE/AIAA, 2009, pp. 1.A.4-1 through 1.A.4-10.*

(Continued)

*Primary Examiner* — Juan Ochoa
(74) *Attorney, Agent, or Firm* — Lorenz & Kopf, LLP

(57) ABSTRACT

A method is provided for performing a simulation on an aircraft. The method includes: receiving, at an onboard maintenance computer (OMC) a simulation script that includes one or more steps for adjusting at least one parameter of the aircraft; processing, by the OMC, the simulation script to determine simulation data; and sending the simulation data from the OMC to one or more signal producer member systems of the aircraft to adjust the at least one parameter of the aircraft.

21 Claims, 7 Drawing Sheets

(56) References Cited

U.S. PATENT DOCUMENTS

| | | | |
|---|---|---|---|
| 6,789,007 B2* | 9/2004 | Ellis et al. | 701/34.3 |
| 6,799,154 B1 | 9/2004 | Aragones et al. | |
| 6,868,319 B2* | 3/2005 | Kipersztok | G05B 23/0278 |
| | | | 701/32.9 |
| 7,536,277 B2 | 5/2009 | Pattipatti et al. | |
| 7,702,435 B2* | 4/2010 | Pereira et al. | 701/30.8 |
| 7,788,002 B2* | 8/2010 | Yukawa | G05B 23/0267 |
| | | | 340/853.2 |
| 7,895,047 B2 | 2/2011 | Wetzer et al. | |
| 8,000,844 B2 | 8/2011 | Mottura | |
| 8,090,462 B2 | 1/2012 | Wininger et al. | |
| 8,155,941 B2 | 4/2012 | Higuchi et al. | |
| 8,378,853 B2* | 2/2013 | Smith et al. | 340/963 |
| 8,832,497 B2* | 9/2014 | Bluvband et al. | 714/26 |
| 2002/0198639 A1* | 12/2002 | Ellis | G06Q 10/06 |
| | | | 701/29.1 |
| 2004/0199307 A1* | 10/2004 | Kipersztok et al. | 701/29 |
| 2005/0028033 A1* | 2/2005 | Kipersztok et al. | 714/27 |
| 2005/0149234 A1* | 7/2005 | Vian et al. | 700/279 |
| 2006/0025908 A1* | 2/2006 | Rachlin | 701/29 |
| 2006/0061118 A1* | 3/2006 | Golden | B64C 1/1484 |
| | | | 296/37.7 |
| 2006/0190280 A1* | 8/2006 | Hoebel et al. | 705/1 |
| 2007/0215745 A1* | 9/2007 | Fleury | G01C 23/005 |
| | | | 244/2 |
| 2008/0009983 A1* | 1/2008 | Mottura | 701/3 |
| 2011/0313614 A1* | 12/2011 | Hinnant et al. | 701/33 |
| 2012/0179326 A1* | 7/2012 | Ghelam | 701/31.9 |

OTHER PUBLICATIONS

A. A Ahmadi, et al., "Assessment of Operational Consequences of Aircraft Failures: Using Event Tree Analysis," Aerospace Conference, IEEE, 2008, pp. 1-14.*

M. Hill, et al "Non-Interference Analysis for Mixed Criticality Code in Avionics Systems," Automated Software Engineering. Proceedings ASE 2000. The Fifteenth IEEE International Conference on, 2000, pp. 257-260.*

Badler N., et al.; Untied States Air Force Research Laboratory, Design Concepts for Automating, Maintenance Instructions, AFRL-HE-WP-TR-2000-0088; Human Effectiveness Directorate, Deployment and Sustainment Division, Sustainment Logistics Branch, OH, (Feb. 2000.).

AGARD-R-821; AGARD, Advisory Group for Aerospace Research & Development, France, Virtual Manufacturing; Papers presented at the 85th Meeting of the AGARD Structures and Materials Panel, held in Aalborg, Denmark, Oct. 13-14, 1997.

EP Examination Report for Application No. 14158151.2 dated Jun. 7, 2016.

EP Search Report for Application No. 14158151.2-1807 / 2778809 dated Jul. 4, 2016.

* cited by examiner

| Step | Parameter | Set Point | Change Rate | Duration | Repeat | Special Fx | Comment |
|---|---|---|---|---|---|---|---|
| 0 | Ads1\calibratedAirspeed | 1000 | - | 5 | - | Step | Step to 1000 and hold for 5 s |
|   | Ads2\calibratedAirspeed |   |   |   |   |   |   |
|   | Ads1\pressureAltitude | 3000 | - | 5 | - | Step | Step to 3000 and hold for 5 s |
| 1 | Ads1\calibratedAirspeed |   |   |   |   |   |   |
|   | Ads2\calibratedAirspeed | 2000 | 250 | 5 | - | Ramp | Ramp to 2000 at 250 / s (for 4 s, then hold for 1 s) |
|   | Ads1\pressureAltitude | 2500 | -100 | - | - | Ramp | Ramp to 2500 at -100 / s (for 5 s) |
| 2 | Ads1\pressureAltitude | 3000 | - | - | - | Step | Step to 3000 and no hold |
| 3 | Ads1\pressureAltitude | 2000 | -250 | 4 | 5 | Saw | Sawtooth from 3000 to 2000 five times at -250 / s no hold |
| 4 | Ads1\calibratedAirspeed | 3000 | - | 3 | 3 | Sine | Sinusoid from 2000 to 3000 three times, 3 s/cycle no hold |

FIG. 2

SIMULATION METHODS AND SYSTEMS FOR AN AIRCRAFT

TECHNICAL FIELD

The present disclosure generally relates to methods and systems for driving simulations in an aircraft, and more particularly to methods and systems for driving simulations from a low criticality maintenance system in an aircraft.

BACKGROUND

Confirmation of the proper operation of an aircraft or an aircraft system is typically required during the production of the aircraft system and/or in association with a maintenance procedure being performed on the aircraft system. This confirmation, often times, requires simulating or reproducing a particular environment or flight scenario of the aircraft. In order to reproduce the particular environment or flight scenario, a series of artificial maneuvers are created by manipulating one or more flight parameters over a range of values. This typically requires the time consuming process of setting breakers, disconnecting sensors, and connecting multiple pieces of automated test equipment with pre-programmed simulation scripts to reproduce the conditions.

The industry has recognized the value of providing an on-aircraft embedded capability to drive such simulations to alleviate the manual configuration and need for ground equipment. However, current approaches perform such simulations using high criticality software functions where design and implementation costs are at a premium. Hence, there is a need for improved systems and methods for simulating aircraft operations onboard the aircraft using lower criticality systems to reduce design and implementation costs. Other desirable features and characteristics will become apparent from the subsequent detailed description and the appended claims, taken in conjunction with the accompanying drawings and the foregoing technical field and background.

BRIEF SUMMARY

In one embodiment, a method is provided for performing a simulation on an aircraft. The method includes: receiving, at an onboard maintenance computer (OMC), a simulation script that includes one or more steps for adjusting at least one parameter of the aircraft; processing, by the OMC, the simulation script to determine simulation data; and sending the simulation data from the OMC to one or more signal producer member systems of the aircraft to adjust the at least one parameter of the aircraft.

In another embodiment, a system is provided for performing a simulation on an aircraft. The system includes: an onboard maintenance computer (OMC) that receives a simulation script that includes one or more steps for adjusting at least one parameter of the aircraft, and that processes the simulation script to determine simulation data. One or more signal producer member systems receive the simulation data from the OMC and adjust the at least one parameter of the aircraft based on the simulation data.

Furthermore, other desirable features and characteristics of the method and system will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following figures, wherein like numerals denote like elements, and wherein:

FIG. 2 is table illustrating steps of an exemplary simulation script of the simulation system in accordance with exemplary embodiments.

DETAILED DESCRIPTION

The following detailed description is merely exemplary in nature and is not intended to limit the disclosure or the application and uses of the disclosure. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
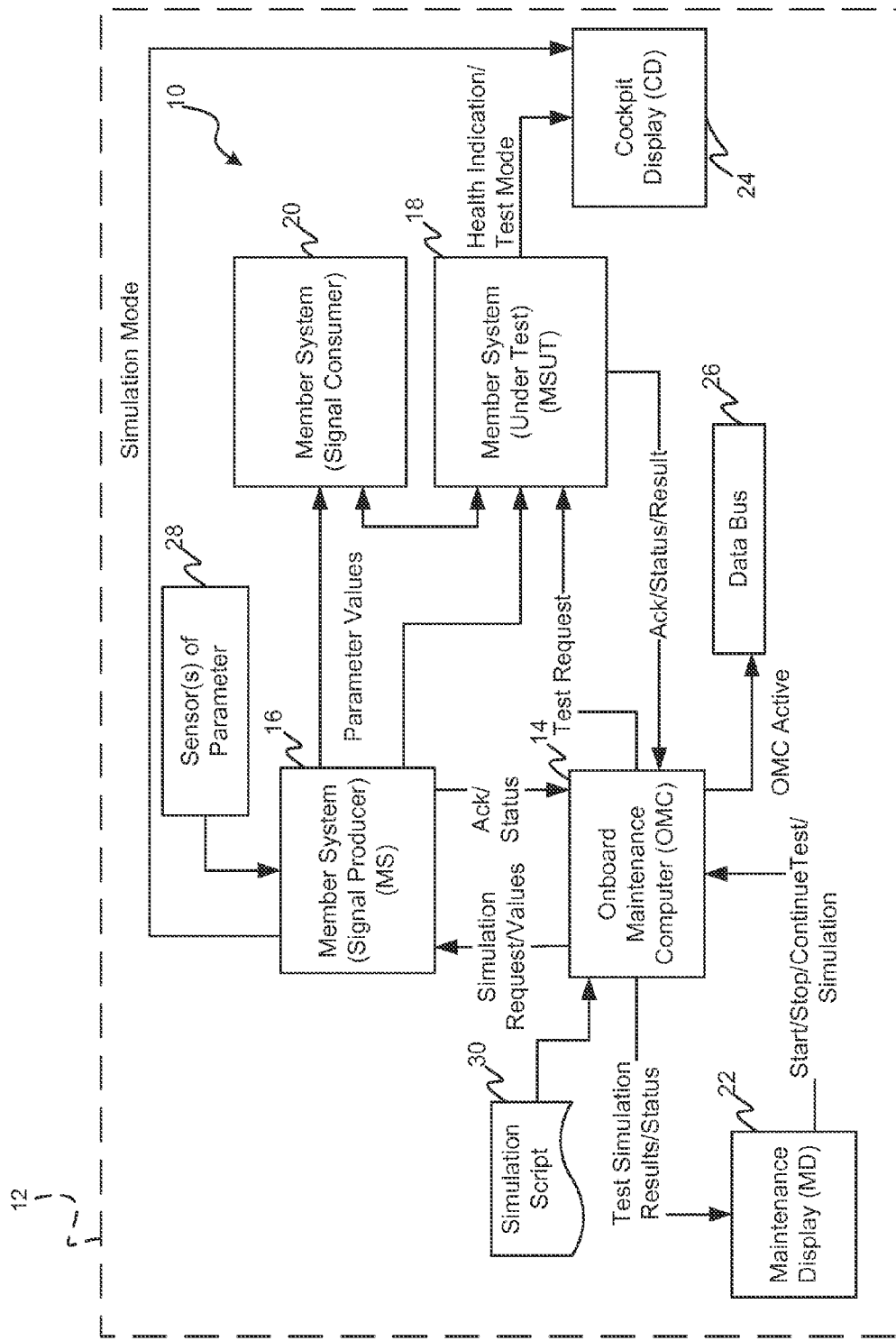
FIG. 1 is a functional block diagram illustrating a simulation system for an aircraft in accordance with exemplary embodiments.

Referring now to FIG. 1, exemplary embodiments of the present disclosure are directed to a simulation system shown generally at 10 that is associated with an aircraft 12. As can be appreciated, the simulation system 10 described herein includes components such as, but is not limited to, an onboard maintenance computer (OMC) 14, a plurality of member systems (MS) 16-20, a maintenance display (MD) 22, and a cockpit display (CD) 24 that communicate over a data bus 26. The components 14-20 of the simulation system 12 are generally ranked according to a level of criticality. The level of criticality relates, for example, to the safety level and/or security level of the component with respect to the aircraft 12. For example, the onboard maintenance computer 14 may have a lower level of criticality; and the member systems 16-20 may have a higher level of criticality due to the operations that they perform on the aircraft 12. In general, the simulation system 10 initiates the simulation using the components having a lower criticality level.

For example, in various embodiments at least one of the plurality of member systems 16-20 is a signal producing member system 16 that may receive signals from one or more sensors 28. As can be appreciated, the simulation system 10 can include any number of signal producing member systems 16. For ease of the description, the disclosure will be discussed in the context of a single signal producing member system 16.

The sensors 28 measure observable conditions of the aircraft 12 and generate sensor signals based thereon. The signal producing member system (MS) 16 receives the sensor signals and processes the sensor signals to determine operating parameter values of the aircraft 12 or may produce operating parameters independently from sensor signal values. One or more of the remaining member systems 18-20 receive the parameter values generated by the signal producing member system 16 and perform one or more aircraft operations based on the parameter values.

At least one of the remaining member systems 18-20 is a member system under test (MSUT) 18. In other words, the operations performed by the member system under test 18 are operations that are being tested to confirm proper operation. In various embodiments, the member system under test 18 can perform a particular test (i.e., a series of planned operations) to confirm proper operation and/or can perform usual operations to confirm proper operation. The member system under test 18 generates test results and/or an indication of the overall health of the member system under test 18 based on the performance of the operations. The cockpit display 24 receives the test mode and/or health indication and displays the information for viewing by, for example, a maintainer of the aircraft 12. If in the event a test were initiated, the maintenance display 22 receives the test results and displays the information for viewing by, for example, maintenance personnel of the aircraft 12.

In order to test the operation of the member system under test 18, the parameter values generated by the signal producing member system 16 are simulated. For example, the signal producing member system 16 uses simulated values for the parameter values instead of the sensed values that are sensed from the sensors 28. In various embodiments, the simulated values are received from a simulation script 30 either directly or indirectly.

As shown in FIG. 2, the simulation script 30 includes one or more steps 40 (e.g., labeled 0-4). The steps 40 are defined by one or more fields 42-52. The fields 42-52 include data for setting a parameter to a particular value or a series of values. The fields 42-52 include for example, but are not limited to a parameter field 42, a set point field 44, a change rate field 46, a duration field 48, a repeat field 50, and a special function field 52. The parameter field 42, for example, defines the parameter to be adjusted. The set point field 44, for example, defines the value to which the parameter is to be adjusted. The change rate field 46, for example, defines the rate at which the parameter is to be changed to achieve the set point value. The duration field 48, for example, defines the overall duration of the step which may, in the simplest case, be the time in which the parameter is to hold the set point value. The repeat field 50, for example, indicates how many times the set point should be repeated. The special function field 52, for example, indicates whether a particular function should be used to adjust the parameter to the set point value.

For example, the fields of step 0 indicate that each parameter "calibratedAirspeed" should step to 1000 and hold for five seconds, while the parameter "pressureAltitude" should step to 3000 and hold for five seconds. The fields of step 1 indicate that the parameter "calibratedAirspeed" should ramp from 1000 to 2000 at a rate of 250 per second and then hold for one second, while the parameter "pressureAltitude" should ramp from 3000 to 2500 at a rate of −100 per second for five seconds. The fields of step 2 indicate that the parameter "pressureAltitude" should step to 3000 (with no hold). The fields of step 3 indicate that the parameter "pressureAltitude" should sawtooth from 3000 to 2000 five times at a rate of −250 per second (with no hold). The fields of step 4 indicate that the parameter "calibratedAirspeed" should sinusoid from 2000 to 3000 three times at a three second cycle (with no hold). As can be appreciated, FIG. 2 is merely exemplary in nature, as any number of varying steps can be implemented in the simulation script 30 that relate to any number of parameters of the aircraft 12.

With reference back to FIG. 1, the onboard maintenance computer 14 receives and processes the simulation script 30. In various embodiments, the onboard maintenance computer 14 processes the simulation script 30 and determines the simulation parameter values. In these embodiments, the onboard maintenance computer 14 sends simulation data including a request to the signal producing member system 16 to produce the particular simulated parameter values. For example, the onboard maintenance computer 14 processes step 0 of FIG. 2 and generates a plurality of request messages to step the parameter "calibratedAirSpeed" to 1000 and hold for five seconds, and generates a plurality of messages to step the parameter "pressureAltitude" to 3000 and hold for five seconds.

In various other embodiments, the onboard maintenance computer 14 processes the simulation script 30 and determines a simulation step 40. In these embodiments, the onboard maintenance computer 14 generates simulation data including an instruction to the signal producing member systems 16 to interpret and to produce the parameter value or the series of parameter values contained within the step 40. For example, the onboard maintenance computer 14 processes step 0 of FIG. 2 and generates an instruction containing data from the fields 42-52 of the step. The signal producing member systems 16 receives and interprets the instruction and steps the parameter "calibratedAirSpeed" to 1000 and holds the parameter for five seconds and steps the parameter "pressureAltitude" to 3000 and holds the parameter for five seconds.

In still other embodiments, the onboard maintenance computer 14 transmits the entire simulation script 30 or a grouping of steps of the simulation script 30 to the signal producing member system 16. In these embodiments, the signal producing member system 16 processes the steps of the simulation script 30 to determine the parameter values.

In any of the embodiments, the onboard maintenance computer 14 generates a test and/or simulation status, and test and/or simulation results. The maintenance display 22 receives the results and/or statuses and displays the information for viewing by, for example, maintenance personnel of the aircraft 12. The maintenance personnel may interact with the maintenance display 22 to generate start, stop, and continue requests for the test and/or simulation.

Referring now to FIGS. 3-7 and with continued reference to FIGS. 1 and 2, sequence diagrams illustrate simulation methods that may be performed by the simulation system 10 in accordance with various exemplary embodiments. The exemplary embodiments shown illustrate simulations methods that may be performed when the onboard maintenance computer (OMC) 14 generates the parameter values for use by the signal producing member system (MS) 16. As can be appreciated, similar methods can be performed when the onboard maintenance computer 14 sends instructions or the entire simulation script 30 as opposed to the parameter values.

As can be appreciated in light of the disclosure, the order of operation within the methods is not limited to the sequential execution as illustrated in FIGS. 3-7, but may be performed in one or more varying orders as applicable and in accordance with the present disclosure. As can further be appreciated, one or more steps of the methods may be added or removed without altering the spirit of the method.

Figure 3:
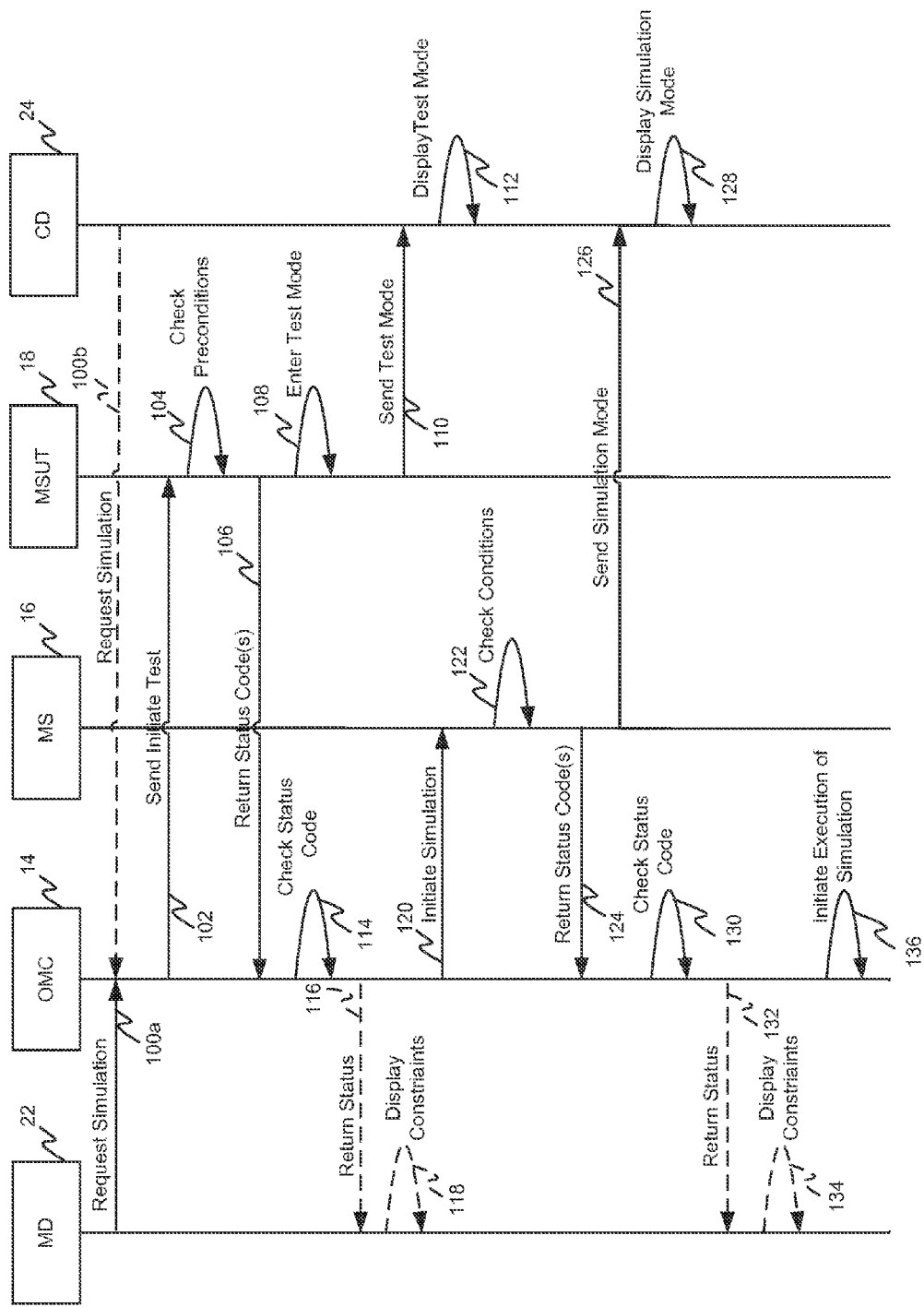
FIGS. 3 through 7 are sequence diagrams illustrating simulation methods that may be performed by the simulation system in accordance with various exemplary embodiments.

With reference now to FIG. 3, a sequence diagram illustrates an exemplary sequence that may be performed to initiate the simulation on the aircraft 12. As shown, a request to begin the simulation is initiated by either a user interacting with the maintenance display 22 or by a user interacting with the cockpit display 24 at 100a, 100b. Optionally, in response to the request, the OMC 14 sends an initiate test request to the MSUT 18 at 102. For example, the MSUT 18 may or may not need to be informed about a test. (e.g., because the MSUT 18 is not actually performing a particular test for the simulation). If the OMC 14 sends the initiate test request to the MSUT 18 at 102, the MSUT 18 checks any preconditions for performing the test at 104 and returns any test status codes that result from the preconditions check at 106. The MSUT 18 enters the test mode at 108 when the preconditions indicate the test may be entered, and sends the test mode status to the CD 24 at 110. The CD 24 displays the test mode at 112.

At 114, the OMC 14 checks the status code returned from the MSUT 18. If the status code indicates not approved to the OMC 14, in other words the MSUT 18 determines the test should not occur, the OMC 14 returns the denied status to the MD 22 at 116 and the MD 22 displays the constraints associated with the status code at 118. Thus, the test and the simulation do not occur.

If, however, the status code indicates approval by MSUT 18 to the OMC 14, in other words the MSUT 18 determines that the test should occur; the OMC 14 sends an initiate simulation request to the MS 16 at 120. The MS 16 checks any preconditions for initiating the simulation at 122 and returns any simulation status codes that result from the preconditions check at 124. The MS 16 sends the simulation mode to the CD 24 at 126. The CD 24 displays the simulation mode at 128.

At 130, the OMC 14 checks the status code returned from the MS 16. If the status code indicates not approved to the OMC 14, in other words the MS 16 determines the simulation should not occur, the OMC 14 returns the denied status to the MD 22 at 132 and the MD 22 displays the constraints associated with the status code at 134. Thus, the simulation does not occur.

If, however, the status code indicates approval by the MS 16 to the OMC 14, in other words the MS 16 determines that the simulation should occur; the OMC 14 initiates execution of the simulation at 136. Execution of the simulation will be described in further detail with regard to FIGS. 4-7.

Figure 4:
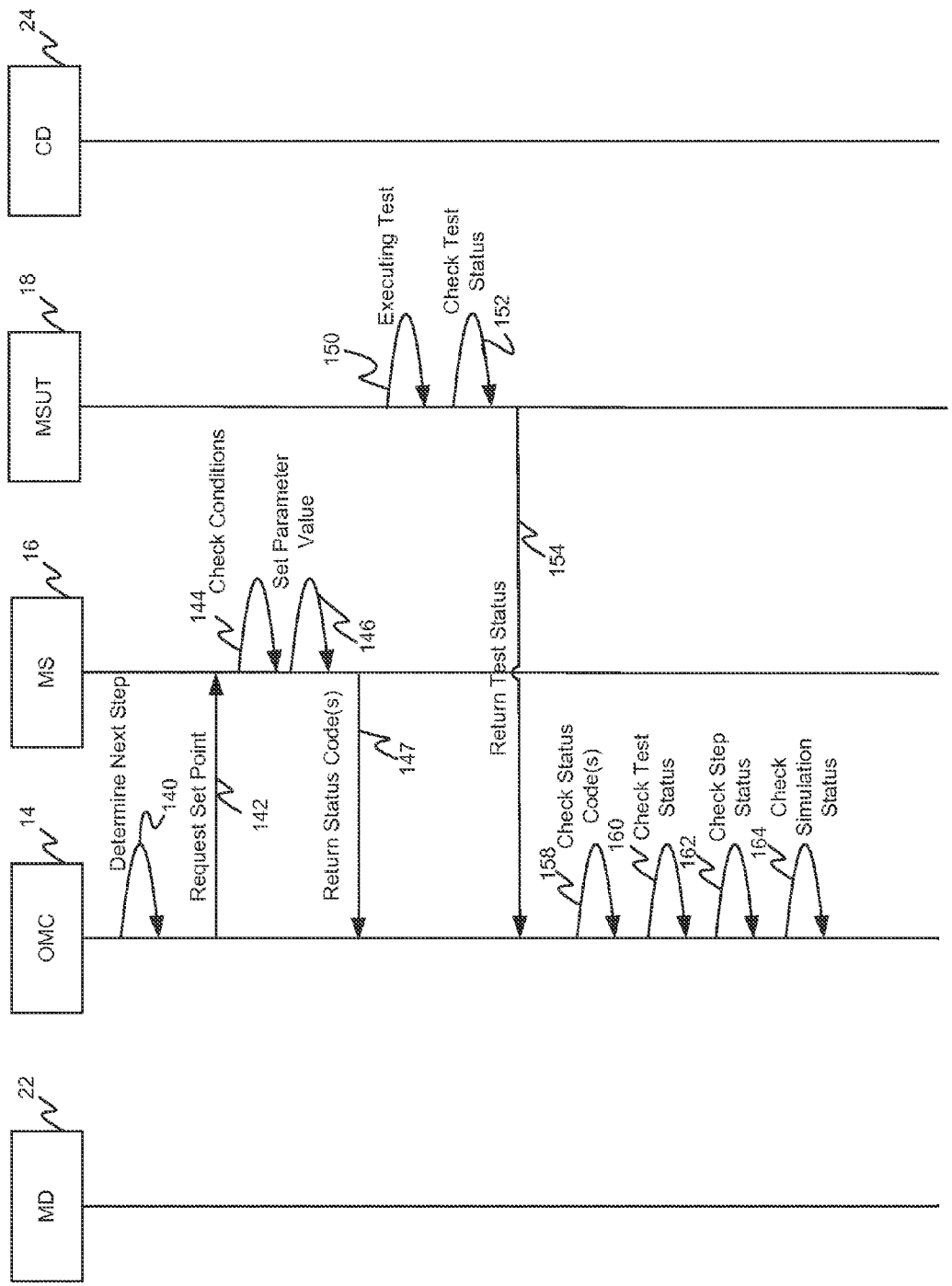
Figure 5:
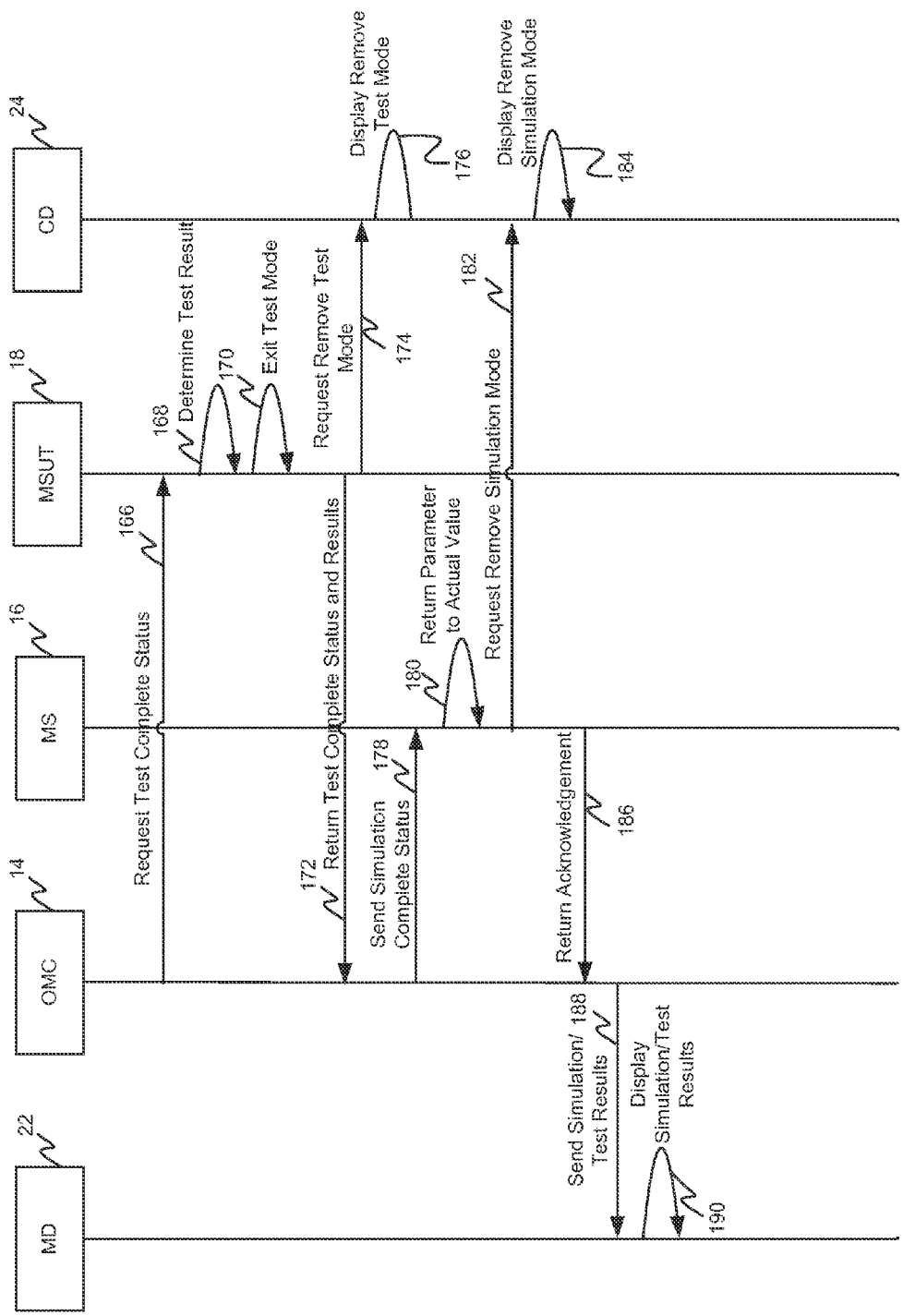
Figure 6:
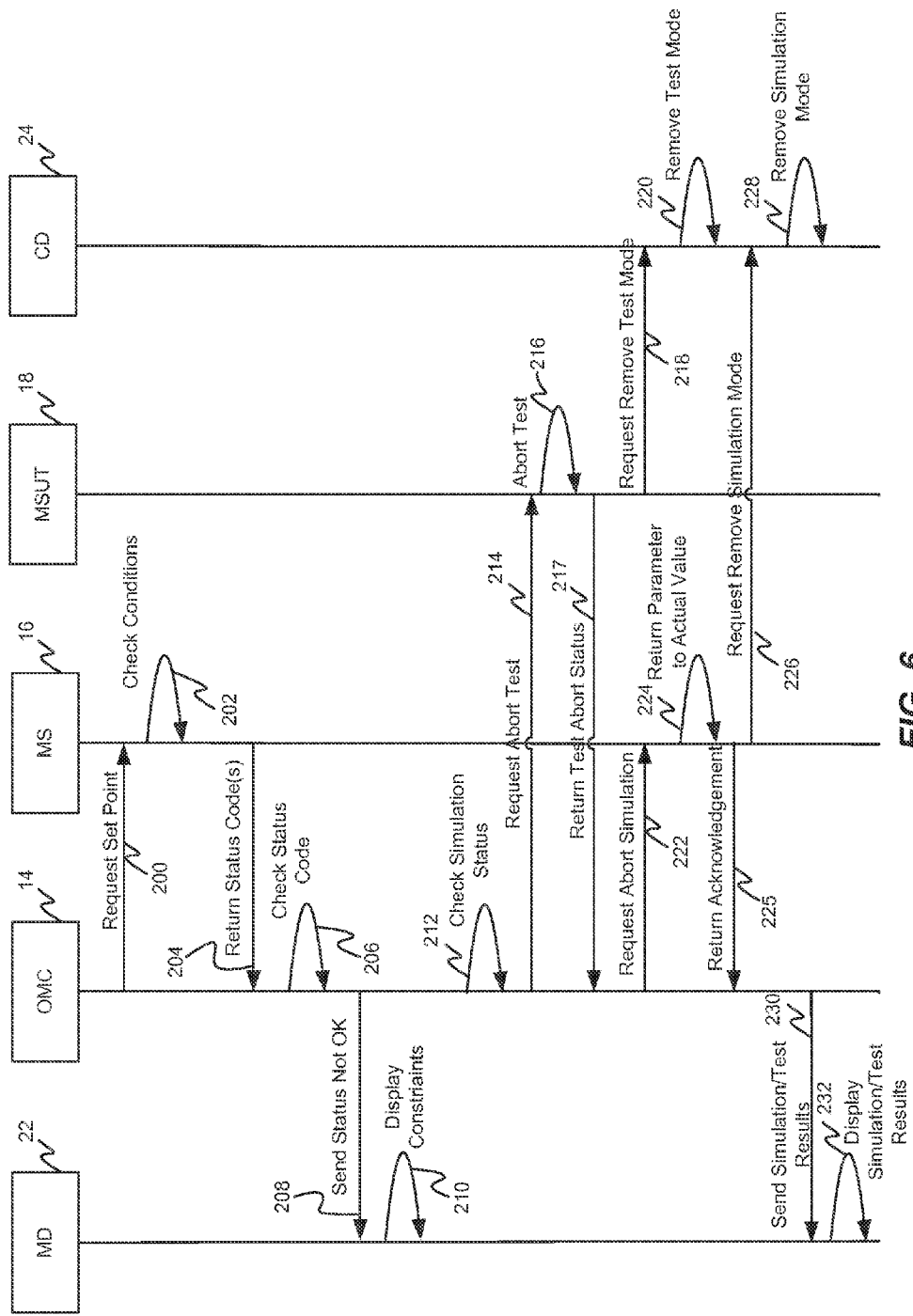
Figure 7:
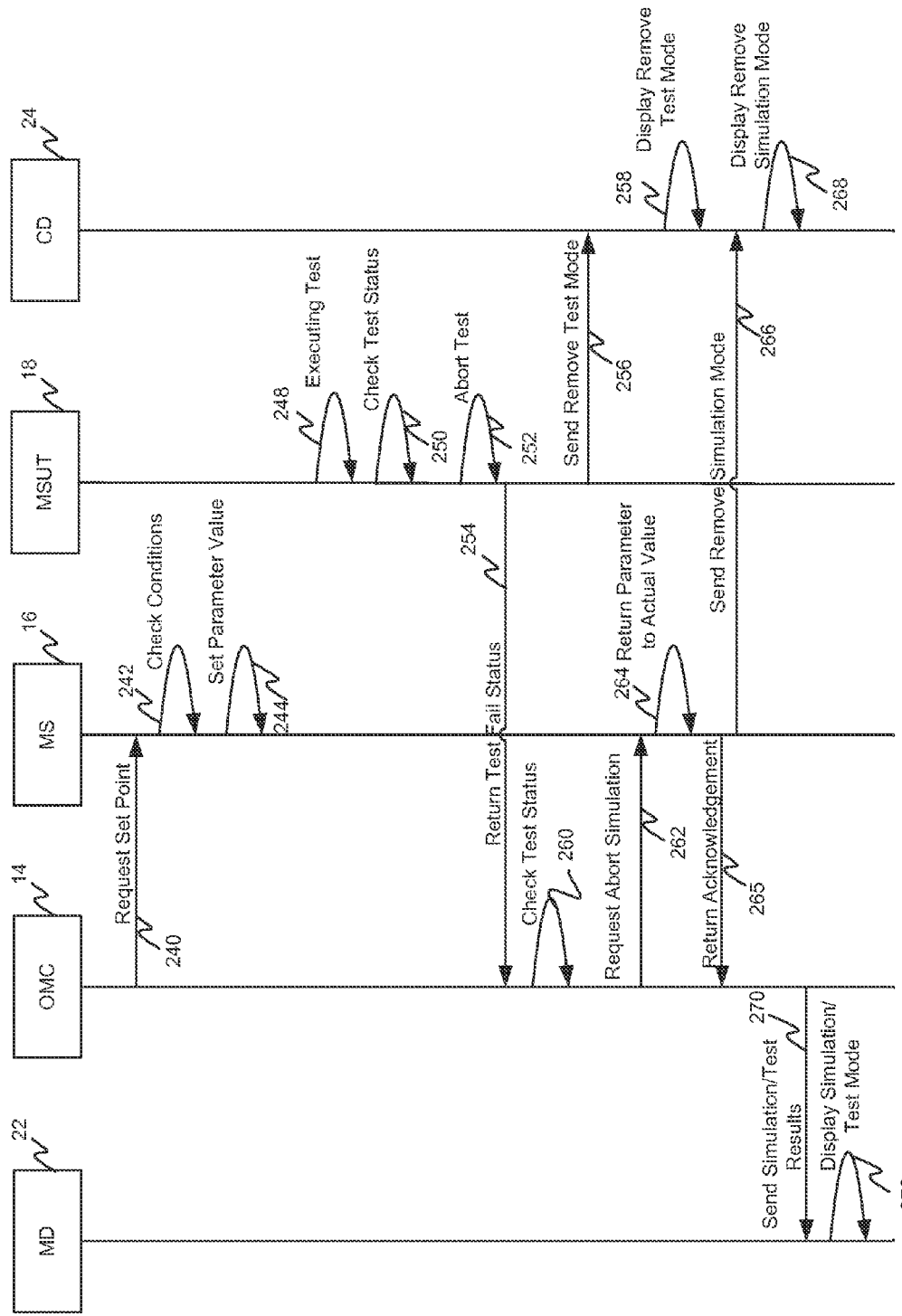

With reference to FIGS. 4 and 5, sequence diagrams illustrate exemplary sequences that may be performed to perform the simulation on the aircraft, once the simulation has been initiated. FIGS. 4 and 5 illustrate the sequences of steps that may occur when conditions of the MS 16 and the MSUT 18 all pass. As will be discussed in further detail below, FIGS. 6 and 7 illustrate a sequence of steps that may occur when conditions of the MS 16 and/or the MSUT 18 fail.

As shown in FIG. 4, the OMC 14 evaluates the simulation script 30 at 140 to determine the next step 40 of the simulation script 30 (e.g., the OMC 14 begins with step 0, and then proceeds to step 1, and so on). The OMC 14 evaluates the data stored in the fields 42-52 of the next step 40 and requests a set point of a particular parameter based on the data at 142.

At 144, the MS 16 checks any conditions for setting the parameter to the set point. If the conditions pass, the MS 16 sets the parameter value based on the set point at 146 and returns the status code to the OMC 14 at 147. If a test is being performed, the MSUT 18 performs all or part of the test at 150. The MSUT 18 checks the test status at 152. If all of the test or part of the test passes, the MSUT 18 returns the test status to the OMC 14 at 154.

The OMC 14 checks the status code at 158 and checks the test status at 160. When both the status code and the test status indicate that it is ok to proceed, the OMC 14 checks a step status of the simulation script 30 at 162 to determine if the step is complete. If the step status indicates that the step is not complete, then the sequence continues with the OMC 14 requesting the next set point of the current step based on the data of the step, and continues with the steps 144-162. When the step status indicates that the step is complete, the OMC 14 checks a simulation status at 164 to determine if the simulation is complete. If the simulation status indicates that the simulation is not complete, then the sequence continues with the OMC 14 determining the next step at 140 and continues with the steps 142-162.

As shown in FIG. 5, once the simulation is complete, (optionally, if an actual test was performed) the OMC 14 requests a complete test to the MSUT 18 at 166. The MSUT 18 determines any test results at 168, exits the test mode at 170, returns a test complete status and/or results to the OMC 14 at 172, and requests a remove test mode to the CD 24 at 174. The CD 24 displays the removal of the test mode at 176.

At 178, the OMC 14 sends a simulation complete status to the MS 16. The MS 16 returns the parameter to the actual value (e.g., from the sensed value) at 180 and requests a remove simulation mode to the CD 24 at 182. The CD 24 displays the removal of the simulation mode at 184. The MS 16 returns an acknowledgement to the OMC 14 at 186. The OMC 14 provides simulation and/or test results to the MD 22 at 188 and the MD 22 displays the simulation and/or test results at 190. Thereafter, the simulation sequence may end.

With reference to FIGS. 6 and 7, sequence diagrams illustrate exemplary sequences that may be performed to perform the simulation on the aircraft 12, once the simulation has been initiated. FIGS. 6 and 7 illustrate a sequence of steps that may occur when conditions of the MS 16 and/or the MSUT 18 fail. In particular, FIG. 6 illustrates a sequence of steps that may occur when conditions of the MS 16 indicate a simulation failure at the beginning of a test or during a test.

As shown, the OMC 14 evaluates the data from the fields 42-52 of the next step 40 and requests a set point of a particular parameter based on the data at 200. The MS 16 checks any conditions for setting the parameter to the set point at 202. If the conditions do not pass, the MS 16 returns the status code(s) to the OMC 14 at 204. The OMC 14 checks the status code(s) at 206. When the status code(s) indicates that the conditions did not pass, the OMC 14 sends simulation fail status to the MD 22 at 208. The MD 22 displays the simulation fail status at 210.

At 212, the OMC 14 checks the simulation status to determine if the simulation is in progress. When the simulation is in progress, the OMC 14 requests an abort of the test at 214. The MSUT 18 performs operations to abort the test at 216 and returns the test abort status to the OMC 14 at 217. The MSUT 18 requests a removal of the test mode of the CD 24 at 218. The CD 24 displays the remove the test mode at 220.

At 222, the OMC 14 requests an abort of the simulation by the MS 16. The MS 16 returns the parameter to the actual value (e.g., a sensed value) at 224 and returns a simulation abort status acknowledgement to the OMC 14 at 225 and sends a request for removal of the simulation mode to the CD 24 at 226. The CD 24 displays the removal of the simulation mode at 228. The OMC 14 returns the simulation and/or test status to the MD 22 at 230 and the MD 22 displays the simulation and/or the test results at 232. Thereafter, the simulation sequence may end.

FIG. 7 illustrates a sequence of steps that may occur when conditions of the MSUT 18 indicate a test failure at a beginning of the test or during the test.

As shown, the OMC 14 evaluates the data from the fields 42-52 of the next step 40 and requests a set point of a particular parameter based on the data at 240. The MS 16 checks any conditions for setting the parameter to the set point at 242. If the conditions pass, the MS 16 sets the parameter to the set point at 244. If a test is being performed, the MSUT 18 performs all or part of the test at 248. The MSUT 18 checks the test status at 250. If all of the test or part of the test fails, the MSUT 18 performs operations to abort the test at 252, sends a test fail status to the OMC 14 at 254, and sends a request for removal of the test mode to the CD 24 at 256. The CD 24 displays the removal of the test mode at 258.

At 260, the OMC 14 checks the test status. When the test status indicates a test fail, the OMC 14 requests an abort of the simulation to the MS 16 at 262. The MS 16 returns the parameter to the actual value (e.g., from the sensed value) at 264 and returns an acknowledgement of the abort status at 265. The MS 16 requests for removal of the simulation mode to the CD 24 at 266. The CD 24 displays the removal of the simulation mode at 268. The OMC 14 sends the simulation and/or test results to the MD 22 at 270. The MD 22 displays the simulation and/or test results at 272. Thereafter, the simulation sequence may end.

As can be appreciated, in any of the exemplary embodiments of FIGS. 3-7, one or more steps that are illustrated as being performed by the OMC 14 may similarly be performed by the MS 16. For example, in the exemplary embodiments described with regard to FIG. 1, when the instructions are sent to the MS 16 for processing or the simulation script 30 is sent to the MS 16 for processing, the MS 16 can perform any one of steps 140, 142, and 158, and 162 of FIG. 4 (in conjunction with the OMC 14 performing the steps) in order to process the data.

Those of skill in the art will appreciate that the various illustrative logical blocks, modules, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for performing a simulation on an aircraft, comprising:

receiving, at an onboard maintenance computer (OMC) a simulation script for the simulation of a member system under test (MSUT) when the aircraft is not-in-flight that includes one or more steps for adjusting at least one parameter of the aircraft wherein the adjusting is performed on an aircraft during a not-in-flight maintenance;

selectively processing the simulation script to determine simulation data for the MSUT, wherein the selectively processing is performed by at least one of the OMC and one or more signal producer member systems of a plurality of member systems based on a rank of a level of criticality of the at least one of the OMC and the one or more signal producer member systems wherein the MSUT comprises at least a remaining member system from the plurality of member systems and not of the signal producer member systems in order to confirm a proper operation of the MSUT, the selectively processing further comprising:

entering by the MSUT a test mode when a set of preconditions indicates a test may be entered, checking a status code returned from the MSUT, returning a denied status when the status code indicates not approved and displaying constraints associated with the status code wherein the test and the simulation is deemed to not occur, and returning an approved status when the status code indicates approval wherein the test is deemed should occur; and processing the simulation data by the one or more signal producer member systems of the aircraft based on the selectively processing to adjust the at least one parameter of the aircraft.

2. The method of claim 1, wherein the simulation data includes a parameter and a parameter value.

3. The method of claim 2, wherein the processing comprises processing a step of the simulation script to determine the parameter and the parameter value.

4. The method of claim 3, further comprising:
processing, by the one or more signal producer member systems, the parameter and the parameter value of the simulation data; and
adjusting the at least one parameter of the aircraft based on the parameter and the parameter value.

5. The method of claim 1, wherein the simulation data includes a step of the simulation script.

6. The method of claim 4, wherein the processing comprises processing, by the OMC, the simulation script to determine the step.

7. The method of claim 5, further comprising:
processing, by the one or more signal producer member systems, the step of the simulation data; and
adjusting the at least one parameter of the aircraft based on the step of the simulation data.

8. The method of claim 1, wherein the simulation data includes a plurality of steps of the simulation script.

9. The method of claim 8, wherein the processing comprises processing, by the OMC, the simulation script to determine the plurality of steps.

10. The method of claim 9, further comprising:
processing, by the signal producer member system, the plurality of steps of the simulation data; and
adjusting the at least one parameter of the aircraft based on the plurality of steps of the simulation data.

11. The method of claim 1, further comprising:
adjusting, by the signal producer member system, the at least one parameter of the aircraft based on the simulation data; and
performing a test, by a member system under test, using the at least one parameter that was adjusted.

12. The method of claim 11, further comprising selectively displaying, by a cockpit display, at least one of a test mode and a simulation mode.

13. The method of claim 11, further comprising selectively displaying, by a maintenance display, at least one of test results and simulation results.

14. A system for performing a simulation on an aircraft, the simulation system comprising:
an onboard maintenance computer (OMC) that receives a simulation script for a member system under test (MSUT) that includes one or more steps for adjusting at least one parameter of the aircraft, and that selectively processes the simulation script to determine simulation data based on a rank of a level of criticality of the OMC in order to confirm a proper operation of the MSUT wherein the MSUT comprises at least a remaining member system from a plurality of member systems outside of signal producer member systems of the plurality of member systems, the selectively processes further comprises to:

enter by the MSUT a test mode when a set of preconditions indicates a test may be entered, check a status code returned from the MSUT, return a denied status when the status code indicates not approved and to display constraints associated with the status code wherein the test and the simulation is deemed to not occur, and to return an approved status when the status code indicates an approval wherein the test is deemed to should occur;

one or more signal producer member systems that receives the simulation data from the OMC and that adjusts the at least one parameter of the aircraft based on the simulation data wherein the adjust is performed on the aircraft during a not-in-flight maintenance;

processing the simulation data by the one or more signal producer member systems of the aircraft to adjust the at least one parameter of the aircraft; and performing by the MSUT all or part of the test for determining a test status of whether all or a part of the test is passed and for confirming the proper operation of the MSUT.

15. The system of claim 14, wherein the simulation data includes a parameter and a parameter value.

16. The system of claim 15, wherein the OMC processes a step of the simulation script to determine the parameter and the parameter value, and wherein the one or more signal producer member systems adjust the at least one parameter of the aircraft based on the parameter and the parameter value.

17. The system of claim 14, wherein the simulation data includes a step of the simulation script.

18. The system of claim 17, wherein the OMC processes the simulation script to determine the step, and wherein the one or more signal producer member systems adjust the at least one parameter of the aircraft based on the step of the simulation data.

19. The system of claim 14, wherein the simulation data includes a plurality of steps of the simulation script.

20. The system of claim 19, wherein the OMC processes the simulation script to determine the plurality of steps, and wherein the one or more signal producer members system adjusts the at least one parameter of the aircraft based on the plurality of steps of the simulation data.

21. The system of claim 14, further comprising:
a member system under test that performs a test using the at least one parameter that was adjusted; and at least one of a maintenance display and a cockpit display that displays information about at least one of the simulation and the test.

* * * * *